(12) United States Patent
Horiguchi et al.

(10) Patent No.: US 6,385,436 B1
(45) Date of Patent: May 7, 2002

(54) DISTORTION COMPENSATION CIRCUIT

(75) Inventors: Kenichi Horiguchi; Masatoshi Nakayama; Yukio Ikeda, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/429,081

(22) Filed: Oct. 29, 1999

(30) Foreign Application Priority Data

Nov. 5, 1998 (JP) .......................................... 10-314647

(51) Int. Cl.[7] ................................................. H04Q 7/20
(52) U.S. Cl. ........................ 455/63; 455/127; 330/149; 375/297
(58) Field of Search ................................ 455/127, 114, 455/501, 63, 67.3, 295, 73; 375/296, 297, 256, 259, 285, 295; 330/149, 268, 85, 88, 123, 127, 151

(56) References Cited

U.S. PATENT DOCUMENTS

| | | | | |
|---|---|---|---|---|
| 5,532,642 A | * | 7/1996 | Takai | 330/151 |
| 5,617,061 A | * | 4/1997 | Fukuchi | 330/151 |
| 5,691,668 A | * | 11/1997 | Yoshikawa et al. | 330/151 |
| 5,781,069 A | * | 7/1998 | Baskin | 330/149 |
| 5,815,036 A | * | 9/1998 | Yoshikawa et al. | 330/52 |
| 6,037,837 A | * | 3/2000 | Miyaji et al. | 330/149 |
| 6,133,791 A | * | 10/2000 | Horiguchi et al. | 330/151 |
| 6,326,840 B1 | * | 12/2001 | Funada et al. | 330/52 |

OTHER PUBLICATIONS

The Institute of Electronics, Information and Communication Engineers; Technical Report of Ieice, NW96–152, 1997.
IEEE Journal on Selected Areas in Communications, vol. Sac–5, No. 5, pp. 890–895, Jun. 1987.

* cited by examiner

*Primary Examiner*—Tracy Legree
*Assistant Examiner*—Jean A. Gelin

(57) ABSTRACT

Conventional distortion compensation circuits have addressed the problem that their distortion compensation amount is greatly reduced at levels other than the designed power level. The present invention provides a distortion compensation circuit that comprises: a vector adjuster; a linearizer; a linear signal extraction path for extracting part of an input signal from the input side of the vector adjuster; a nonlinear signal extraction path for extracting part of an output signal from the output side of the amplifier; a level detector for detecting a combined power level of the signals from the linear signal extraction path and the nonlinear signal extraction path; and a control circuit for adjusting a bias of the linearizer in accordance with the detected combined power level, electrically adjusting the linearizer so that the power detected by the level detector is minimized, and adjusting the vector adjuster so that the power detected by the level detector is minimized every time the linearizer is adjusted. As a result, the distortion compensation circuit of the present invention can optimize distortion compensation at all times independently of the average power changes of the input signal, the secular changes of the amplifier and the state changes of the amplifier caused by temperature changes.

6 Claims, 11 Drawing Sheets

DISTORTION COMPENSATION CIRCUIT

BACKGROUND OF THE INVENTION

1. Field of the Invention

The present invention relates to a distortion compensation circuit incorporated in a communication apparatus that is used for satellite communications, ground microwave communications, mobile telecommunications and the like.

2. Description of the Related Art

Conventional linearizers will be described with reference to the drawings. FIG. 9 is a diagram showing the basic structure of a first conventional linearizer disclosed in, e.g., "The Institute of Electronics, Information and Communication Engineers, Shingaku-Giho, MW 96-152, 1997."

In FIG. 9, reference numeral 1 denotes an input terminal; 2, an output terminal; 31, a bias terminal; 32, a resistor; 33, a diode; and 34 and 35, capacitors.

This linearizer is an example of an analog predistortion linearizer comprising an analog nonlinear element. This analog predistortion linearizer is a linearizer comprising an analog nonlinear element having amplitude and phase characteristics that are opposite to those of an amplifier with respect to input power changes. While connected in series with an amplifier in the preceding or succeeding stage of the amplifier, the linearizer compensates for the nonlinear characteristics of the amplifier, i.e., the amplitude and phase characteristics of the amplifier with respect to input power changes.

A signal is inputted to the input terminal 1, and led to the anode terminal of the diode 33. A bias voltage is applied to the diode 33 from the bias terminal 31 through the resistor 32. The diode 33 provides the effect of compensating for the amplitude and phase characteristics of the amplifier connected to the preceding or succeeding stage of the linearizer with respect to changes in the power level of the inputted signal. The thus compensated signal is outputted from the output terminal 2.

Next, a second conventional linearizer will be described with reference to the drawing. FIG. 11 is a diagram showing the basic structure of the second conventional linearizer disclosed in, e.g., "IEEE Journal on Selected Areas in Communication, vol. SAC-5, no. 5, pp. 890–895, Apr. 1987."

Reference numeral 1 denotes an input terminal; 2, an output terminal; 7, a directional coupler; 11, an amplifier; 25, a local oscillator; 41, a modulated signal generator; 42, an orthogonal modulator; 43, an orthogonal demodulator; and 44 and 45, reverse-phase adders.

This linearizer is a Cartesian feedback linearizer, which is a type of a feedback linearizer. This feedback linearizer extracts part of an output signal from the amplifier, and the extracted signal is negatively fed back to the input side to thereby compensate for the nonlinear characteristics of the amplifier. Of those linearizers, in a transmitter having an orthogonal modulator, one that is called a Cartesian feedback linearizer is characterized as demodulating an output signal from the amplifier into two orthogonal base band frequency components and subjecting the orthogonal components to negative feedback processes, respectively.

The nonlinear characteristics of the amplifier is compensated for by the following way. Transmitted data is inputted to the input terminal 1, and a modulated signal is generated per orthogonal component by the modulated signal generator 41, and the orthogonal modulator 42 modulates the signal into a radio frequency from the base band frequency. The modulated signal is inputted to the amplifier 11, and part of its output signal is extracted by means of the directional coupler 7. The extracted signal is demodulated into two orthogonal base band frequency components by the orthogonal demodulator 43, and the demodulated components are negatively fed back to the input side.

As shown in FIG. 9, the first conventional linearizer comprises an analog nonlinear element, and usually, its circuit is designed and its bias is set so that the linearizer has the amplitude and phase characteristics opposite to those of the amplifier with respect to input power changes. However, it is, actually, impossible to design amplitude and phase characteristics that are completely opposite to those of the amplifier using analog linear and nonlinear elements. Thus, it is so designed, in reality, that a maximum distortion compensation amount can be obtained when the amplifier outputs a specified average power.

FIG. 10 shows a relationship between the distortion compensation amount and the average output power of the amplifier when the first conventional linearizer is used. This linearizer can implement the maximum distortion compensation amount at a specified average output P1, but its distortion compensation amount is reduced at an output P2 that is deviated from the specified average output P1. Thus, when the first conventional linearizer is used, the distortion compensation amount is greatly reduced at power levels other than the designed power level.

Further, as described above, the second conventional linearizer is a Cartesian feedback linearizer, which is a type of a feedback linearizer. As shown in FIG. 11, this linearizer compensates for the nonlinear characteristics of the amplifier by extracting part of an output signal from the amplifier, and negatively feeding the extracted signal back to the input side. However, at the reverse-phase adders 44 and 45, input signals do not coincide with feedback signals from the output side timewise, and thus, when an input signal changes at a high speed timewise, i.e., when the input signal contains a wide band of frequencies, this linearizer cannot keep distortion compensation automatically optimized.

SUMMARY OF THE INVENTION

The present invention has been made to overcome the aforementioned problems, and therefore has an object of the invention to provide a distortion compensation circuit capable of always optimizing distortion compensation independently of the average power changes of an input signal, the secular changes of an amplifier and the state changes of the amplifier caused by temperature changes, and capable also of compensating for distortions even when an input signal contains a wide band of frequencies.

A distortion compensation circuit according to the present invention comprises: a vector adjuster for electrically adjusting amplitude and phase characteristics of an input signal; a linearizer, constructed of analog linear and nonlinear elements and having amplitude and phase characteristics opposite to those of an amplifier with respect to changes in input power, which is an output from the vector adjuster, for electrically adjusting the amplitude and phase characteristics with respect to the changes in input power, the amplifier being connected to the succeeding stage of the linearizer; a linear signal extraction path for extracting part of the input signal from the input side of the vector adjuster; a nonlinear signal extraction path for extracting part of an output signal from the output side of the amplifier; a level detector for detecting a combined power level of the signals from the linear signal extraction path and the nonlinear signal extraction path; and a control circuit for adjusting a bias of the linearizer in accordance with the detected combined power level, electrically adjusting the linearizer so that the power detected by the level detector is minimized, and adjusting the vector adjuster so that the power detected by the level detector is minimized every time the linearizer is adjusted.

Further, in the distortion compensation circuit according to the present invention, the linear signal extraction path has a signal path constructed of the vector adjuster, the linearizer and the amplifier, and a delay circuit for making delay characteristics of the nonlinear signal extraction path equivalent to delay characteristics of the linear signal extraction path.

Further, the distortion compensation circuit according to the present invention further comprises: a distortion amplification path for causing an auxiliary amplifier to amplify a combined signal obtained by combining the signal of the linear signal extraction path and the signal of the nonlinear signal extraction path; and an output signal path having a second delay circuit for making delay characteristics of the nonlinear signal extraction path and the distortion amplification path equivalent to delay characteristics thereof to thereby form a feed-forward amplifier for compensating for nonlinear characteristics of the amplifier by combining an output signal from the distortion amplification path and an output signal from the output signal path so as to be anti-phase to each other, wherein the level detector extracts a signal at the input side of the auxiliary amplifier in the distortion amplification path, and detects a power level of the extracted signal.

Further, the distortion compensation circuit according to the present invention further comprises: a distortion amplification path for causing an auxiliary amplifier to amplify a combined signal obtained by combining the signal of the linear signal extraction path and the signal of the nonlinear signal extraction path; and an output signal path having a second delay circuit for making delay characteristics of the nonlinear signal extraction path and the distortion amplification path equivalent to delay characteristics thereof to thereby form a feed-forward amplifier for compensating for nonlinear characteristics of the amplifier by combining an output signal from the distortion amplification path and an output signal from the output signal path so as to be anti-phase to each other, wherein the level detector extracts a signal at the output side of the auxiliary amplifier in the distortion amplification path, and detects a power level of the extracted signal.

Further, the distortion compensation circuit according to the present invention comprises, in place of the linearizer, a reverse distortion amplifier having amplitude and phase characteristics opposite to those of the amplifier connected to the succeeding stage thereof with respect to input power changes, wherein the control circuit electrically controls the reverse distortion amplifier and the vector adjuster in accordance with the detected combined power level.

Further, the distortion compensation circuit according to the present invention further comprises: a first frequency converter, inserted into the succeeding stage of the linearizer, for converting an output signal from the linearizer from an intermediate frequency to a radio frequency; and a second frequency converter, inserted into the nonlinear signal extraction path, for converting an output signal from the amplifier from a radio frequency to an intermediate frequency.

DETAILED DESCRIPTION OF THE PREFERRED EMBODIMENTS

First Embodiment

Figure 1:
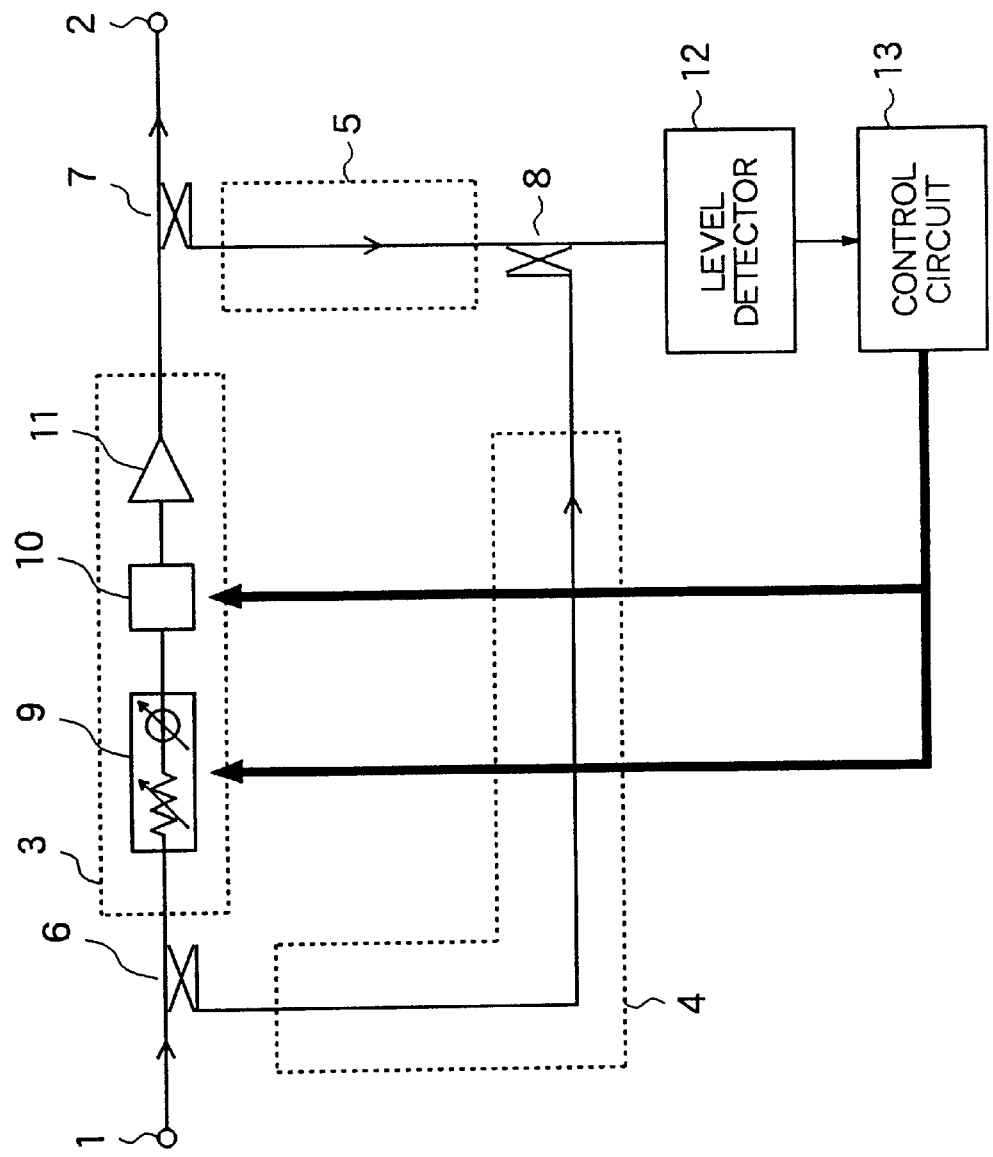
FIG. 1 is a diagram showing the structure of a distortion compensation circuit according to a first embodiment of the present invention.

A distortion compensation circuit according to a first embodiment of the present invention will be described with reference to the drawings. FIG. 1 is a diagram showing the structure of the distortion compensation circuit according to the first embodiment of the present invention. Note that the same reference numerals denote the same or like parts and components in each drawing.

In FIG. 1, reference numeral I denotes an input terminal; 2, an output terminal; 3, a signal path; 41 a linear signal extrication path; 5, a nonlinear signal extraction path; 6, a directional coupler for extracting part of an input signal; 7, a directional coupler for extracting part of an output signal; and 8, a directional coupler for combining signals from the linear signal extrication path 4 and the nonlinear signal extraction path 5.

Further, in FIG. 1, reference numeral 9 denotes a vector adjuster; 10, a linearizer; 11, an amplifier; 12, a level detector for detecting a combined power level obtained by the directional coupler 8; and 13, a control circuit for electrically controlling the vector adjuster 9 and the linearizer 10 so as to minimize the power level detected by the level detector 12.

Figure 2:
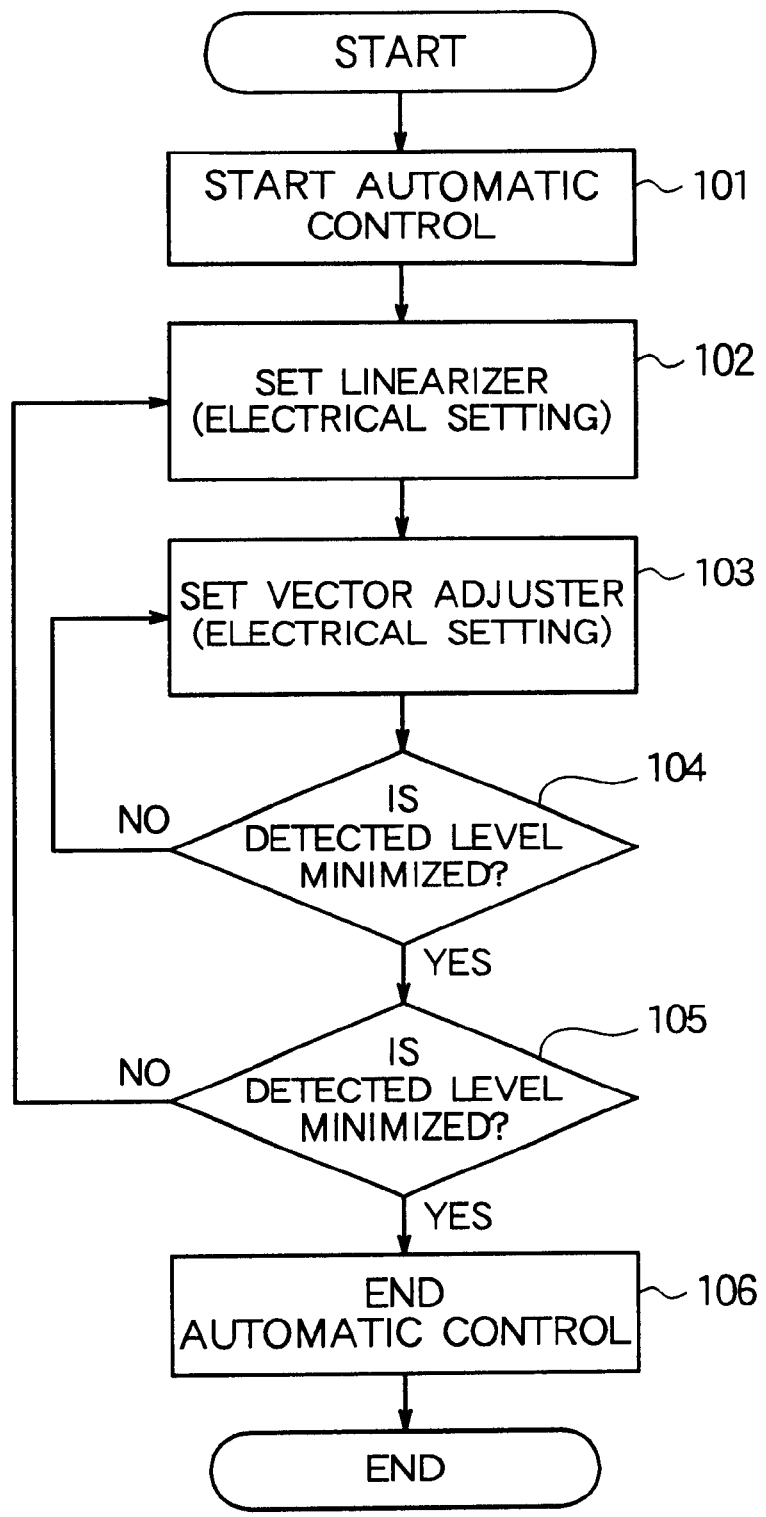
FIG. 2 is a flowchart showing the operation of the distortion compensation circuit according to the first embodiment of the present invention.

Next, the operation of the distortion compensation circuit according to the first embodiment will be described with reference to the drawings. FIG. 2 is a flowchart showing the operation of the distortion compensation circuit according to the first embodiment of the present invention. Further, FIG.

3 is a diagram showing the characteristics of the distortion compensation circuit according to the first embodiment of the present invention.

First, a signal is inputted to the input terminal 1, and the inputted signal is branched into the signal path 3 and the linear signal extraction path 4 by the directional coupler 6. At the signal path 3, the signal passes through the vector adjuster 9, the linearizer 10 and the amplifier 11 in the stated order. The linearizer 10 comprises analog linear and non-linear elements whose amplitude and phase characteristics are opposite to those of the amplifier 11 with respect to input power changes, and can electrically adjust changes in the amplitude and phase characteristics with respect to input power. The vector adjuster 9 can electrically adjust the amplitude and phase characteristics.

Part of an output signal is inputted to the nonlinear signal extraction path 5 by the directional coupler 7, and combined with the input signal that has passed through the linear signal extraction path 4 by the directional coupler 8. The combined power level of the combined signal is detected by the level detector 12. The control circuit 13 electrically controls the linearizer 10 and the vector adjuster 9 so as to minimize the power level detected by the level detector 12.

Upon start of automatic control (step 101 in FIG. 2), the control circuit 13 first initializes the linearizer 10 (step 102). Next, using the value of the vector adjuster 9 as a parameter, the circuit 13 makes a comparison with the detected power in the level detector 12, and adjusts the vector adjuster 9 so that the detected power is minimized (steps 103 and 104). Then, the circuit 13 stores the detected power and the set state of the linearizer 10 (step 105).

When the vector adjuster 9 is optimized, the average power level of a signal, whose frequency component is the same as the frequency component of the input signal out of the signals from the nonlinear signal extraction path 5 and the liner signal extrication path 4, is cancelled. Therefore, only the power level of a distortion component from the amplifier 11 is detected by the level detector 12.

Next, the control circuit 13 changes the setting of the linearizer 10 (step 102), and performs steps 103, 104 and 105 again. In step 105, the circuit 13 compares the detected power with the stored value from the second round of operation onwards, and keeps changing the setting of the linearizer 10 so as to minimize the detected power.

By repeating the above steps, this distortion compensation circuit can optimize the setting of the linearizer 10 while providing the condition that the level detector 12 can detect only the power level of the distortion component from the amplifier 11.

Figure 3:
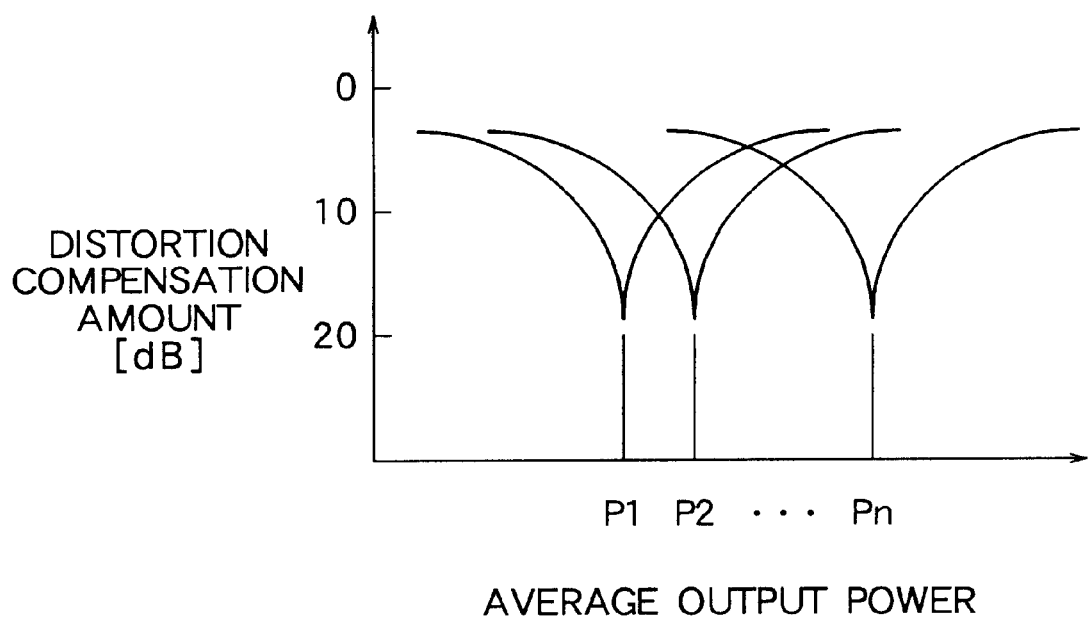
FIG. 3 is a diagram showing the characteristics of the distortion compensation circuit according to the first embodiment of the present invention.

FIG. 3 shows a relationship between the distortion compensation amount and the average output power of the amplifier 11 when the distortion compensation circuit according to the first embodiment is used. In this distortion compensation circuit, the set state of the linearizer 10 is kept updated constantly, and thus the maximum distortion compensation amount can be implemented with respect to the average power changes P1, P2, . . . Pn of a time-varying input signal.

Further, the distortion compensation circuit according to the first embodiment implements such a control as to minimize the combined power of the signals from the linear signal extraction path 4 and the nonlinear signal extraction path 5. Therefore, the gain of the signal path can be kept constant at all times.

As described above, the distortion compensation circuit according to the first embodiment causes the control circuit 13 to optimize the linearizer 10 and causes the circuit 13 to constantly update the optimized state of the linearizer 10. Therefore, distortion compensation can be kept optimized at all times independently of the average power changes of the input signal, the secular changes of the amplifier and the state changes of the amplifier 11 caused by temperature changes.

Further, the linearizer 10 of this distortion compensation circuit comprises analog linear and nonlinear elements whose amplitude and phase characteristics are opposite to those of the amplifier 11 with respect to input power changes. Therefore, even for a signal such as a modulated signal whose envelop exhibits a time-varying power distribution, distortions can be compensated for at all times without depending on the power level of its envelop. As a result, by designing the linearizer 10 so that the linearizer 10 can handle a wide band of frequencies, distortions can be compensated for even when an input signal contains a wide band of frequencies.

Second Embodiment

Figure 4:
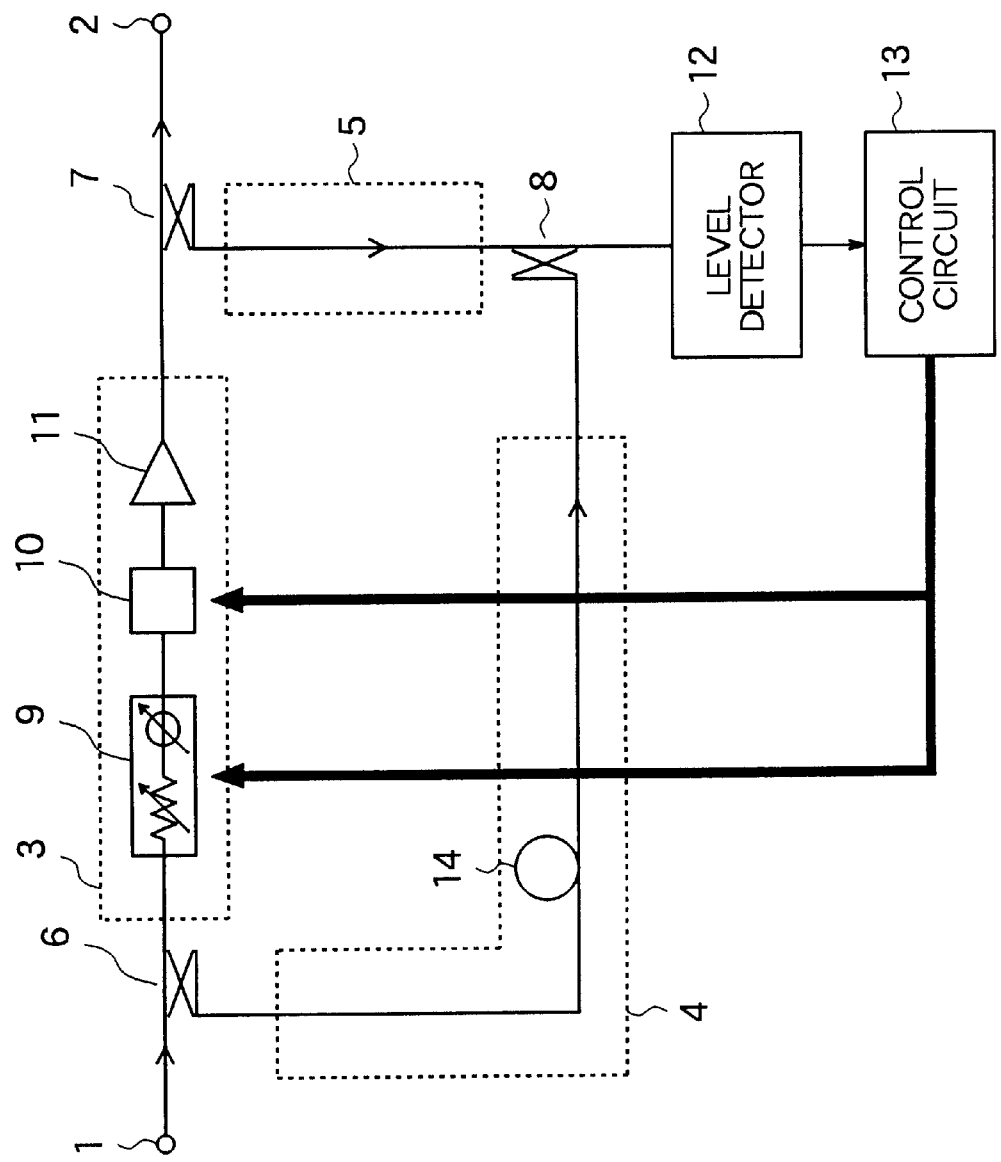
FIG. 4 is a diagram showing the structure of a distortion compensation circuit according to a second embodiment of the present invention.

A distortion compensation circuit according to a second embodiment of the present invention will be described with reference to the drawing. FIG. 4 is a diagram showing the structure of the distortion compensation circuit according to the second embodiment of the present invention.

In FIG. 4, reference numeral 14 denotes a delay circuit. Note that the other structural aspects are equivalent to those of the first embodiment, and thus repeated descriptions will be omitted.

Next, the operation of the distortion compensation circuit according to the second embodiment will be described.

In the second embodiment, the delay circuit 14 is connected to the linear signal extraction path 4. The circuit 14 makes the delay characteristics of the signal path 3 and the nonlinear signal extraction path 5 equivalent to the delay characteristics of the linear signal extraction path 4.

As a result, differences in delay characteristics with respect to frequencies between the two paths can be reduced. Therefore, by decreasing cancellation errors in both paths caused by their frequency characteristics when a signal contains a wide band of frequencies, the detection level of distortion power can be improved.

Third Embodiment

Figure 5:
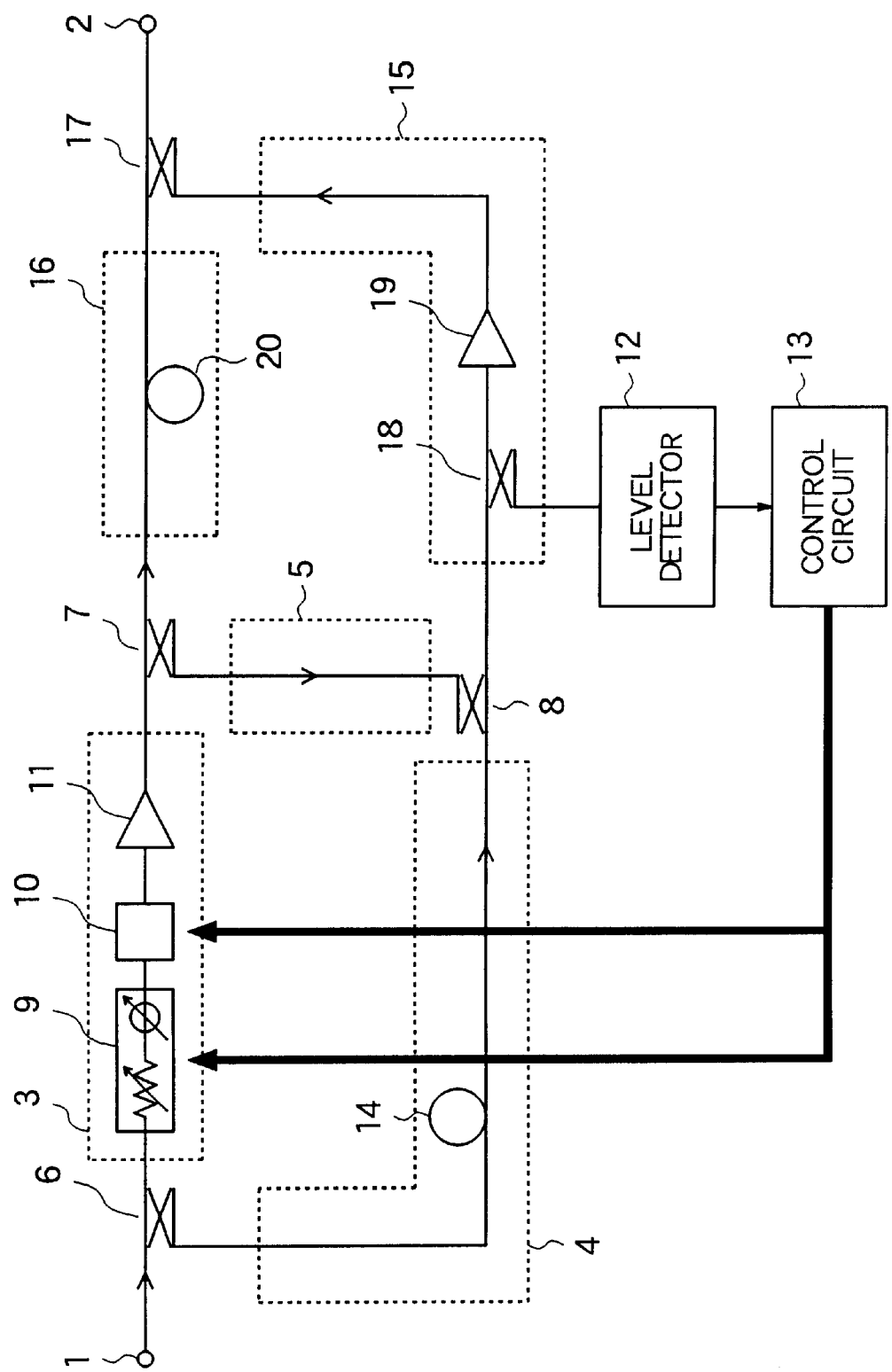
FIG. 5 is a diagram showing the structure of a distortion compensation circuit according to a third embodiment of the present invention.

A distortion compensation circuit according to a third embodiment of the present invention will be described with reference to the drawing. FIG. 5 is a diagram showing the structure of the distortion compensation circuit according to the third embodiment of the present invention.

In FIG. 5, reference numeral 15 denotes a distortion amplification path; 16, an output signal path; 17 and 18, directional couplers; 19, an auxiliary amplifier; and 20, a delay circuit.

The distortion amplification path 15 comprises the directional coupler 18 and the auxiliary amplifier 19. Further, the output signal path 16 comprises the delay circuit 20 that makes the delay characteristics of the nonlinear signal extraction path 5 and the distortion amplification path 15 equivalent to the delay characteristics of the output signal path 16.

The level detector 12 extracts a signal before being inputted to the auxiliary amplifier in the distortion amplification path 15 through the directional coupler 18, and detects the power level of the extracted signal. Note that the other structural aspects are equivalent to those of the first and second embodiments, and thus repeated descriptions will be omitted.

Next, the operation of the distortion compensation circuit according to the third embodiment will be described.

The third embodiment is an application of the first or second embodiment to a feed-forward amplifier. The third embodiment and the first or second embodiment share in common the linear signal extraction path 4, the nonlinear signal extraction path 5, the level detector 12, the control circuit 13 and part of a control algorithm.

In the distortion compensation circuit according to the third embodiment, distortion compensation is implemented by double systems, i.e., a feed-forward amplifier and the distortion compensation system of the second embodiment. Therefore, the third embodiment can provide a distortion compensation amount larger than that provided when only one of them is used singly.

In the distortion compensation circuit according to the third embodiment, distortion power to be outputted from the amplifier 11 can be reduced by the effect of the linearizer 10, compared with the case where the feed-forward amplifier is used singly. As a result, the distortion power level to be inputted to the auxiliary amplifier 19 can be reduced, and thus the auxiliary amplifier 19, which serves to implement the same distortion characteristics as in the case where the feed-forward amplifier is used singly, can be downsized. Therefore, a reduction in the power consumption of the feed-forward amplifier can be implemented.

Further, in the distortion compensation circuit according to the third embodiment, the distortion characteristics of the amplifier 11 can be compensated for by the effect of the linearizer 10. Thus, the distortion compensation amount required to be provided as the feed-forward system for implementing the specified distortion characteristics can be reduced. Therefore, machining accuracy requirements and frequency characteristic requirements imposed on the feed-forward amplifier can be reduced.

Fourth Embodiment

Figure 6:
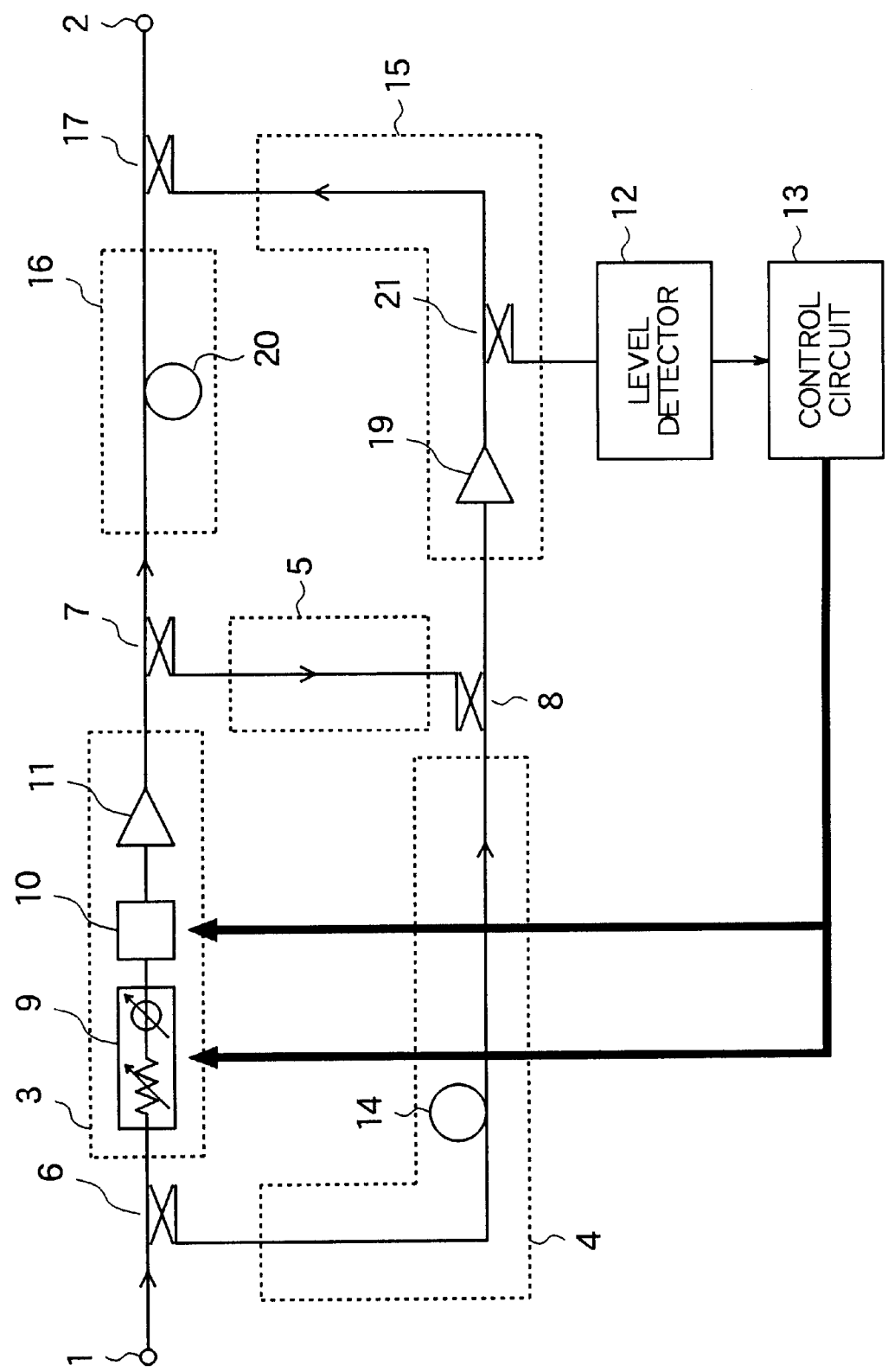
FIG. 6 is a diagram showing the structure of a distortion compensation circuit according to a fourth embodiment of the present invention.

A distortion compensation circuit according to a fourth embodiment of the present invention will be described with reference to the drawing. FIG. 6 is a diagram showing the structure of the distortion compensation circuit according to the fourth embodiment of the present invention.

In FIG. 6, reference numeral 21 denotes a directional coupler. Note that the other structural aspects are equivalent to those of the third embodiment, and thus repeated descriptions will be omitted.

Next, the operation of the distortion compensation circuit according to the fourth embodiment will be described.

In the distortion compensation circuit according to the fourth embodiment, the level detector 12 extracts a signal after being outputted from the auxiliary amplifier in the distortion amplification path 15 through the directional coupler 21, and detects the power level of the extracted signal. As a result, the level detector 12 can detect the power level including the output characteristics of the auxiliary amplifier 19.

Fifth Embodiment

Figure 7:
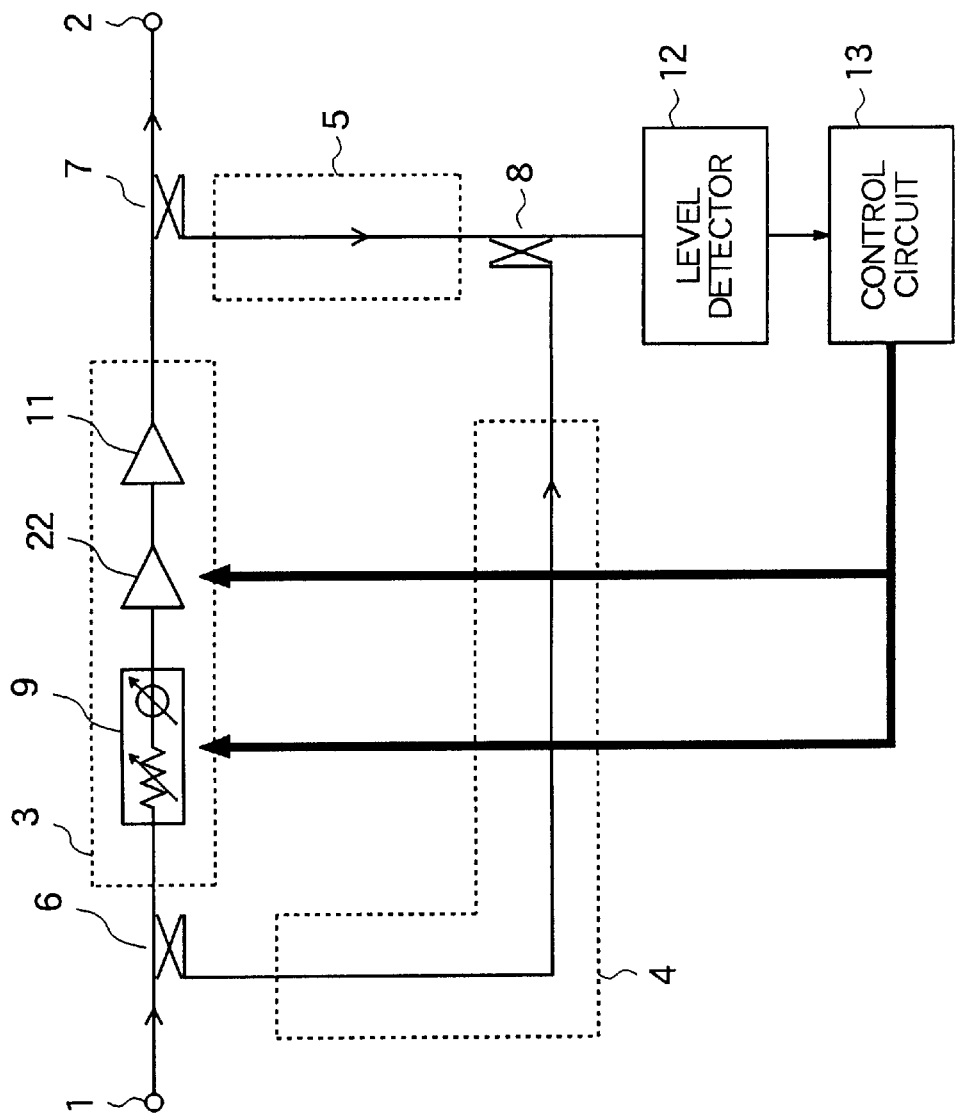
FIG. 7 is a diagram showing the structure of a distortion compensation circuit according to a fifth embodiment of the present invention.

A distortion compensation circuit according to a fifth embodiment of the present invention will be described with reference to the drawing. FIG. 7 is a diagram showing the structure of the distortion compensation circuit according to the fifth embodiment of the present invention.

In FIG. 7, reference numeral 22 denotes a reverse distortion amplifier that substitutes for the linearizer and exhibits amplitude and phase characteristics opposite to those of the amplifier 11 with respect to input power changes. Note that the other structural aspects are equivalent to those of the first embodiment, and thus repeated descriptions will be omitted.

Next, the operation of the distortion compensation circuit according to the fifth embodiment will be described.

The control circuit 13 electrically controls the reverse distortion amplifier 22 and the vector adjuster 9. By using the reverse distortion amplifier 22 as a driver stage of the amplifier 11, the distortion compensation circuit can be downsized. Note that this structure can, of course, be applied to other embodiments.

Sixth Embodiment

Figure 8:
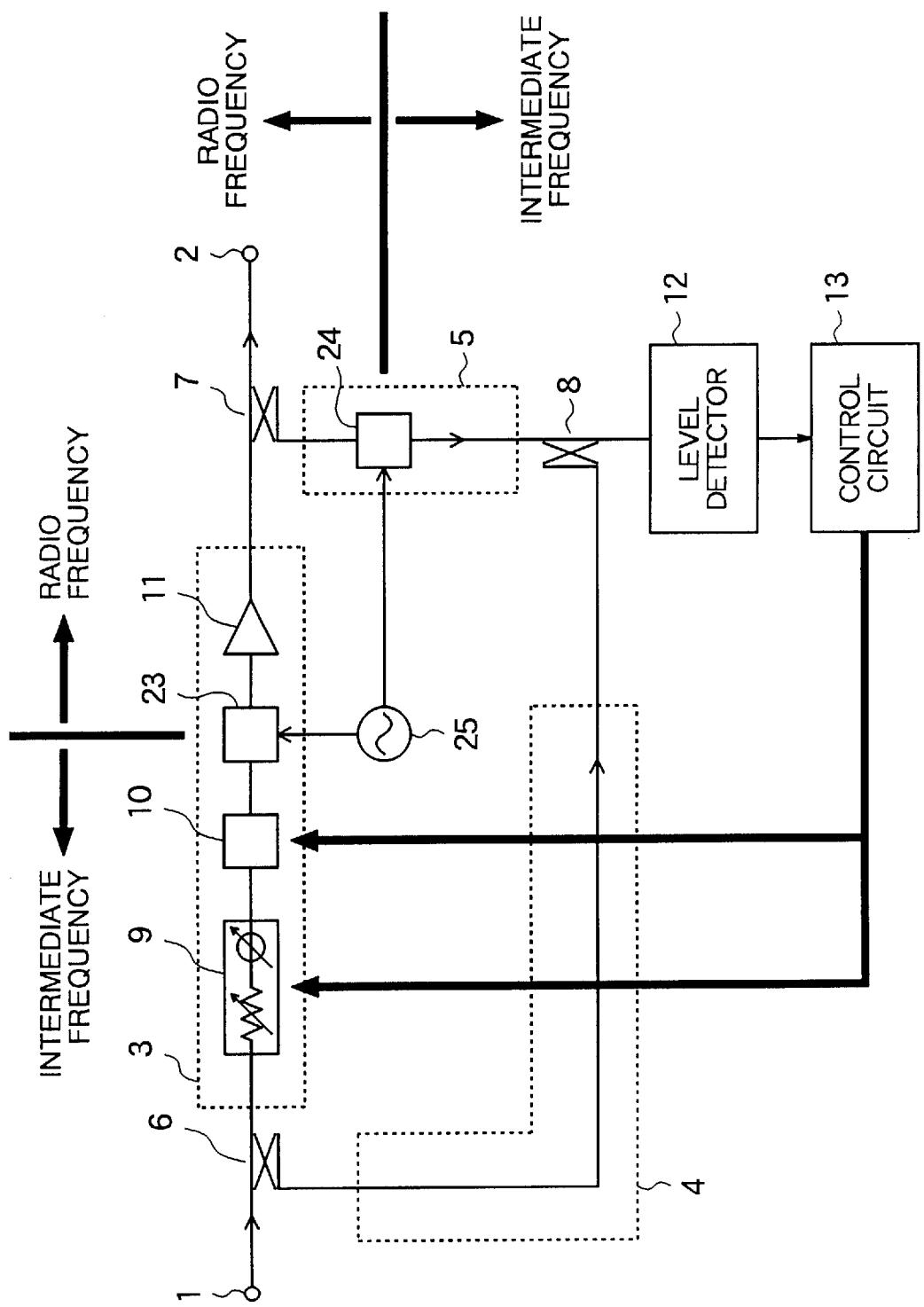
FIG. 8 is a diagram showing the structure of a distortion compensation circuit according to a sixth embodiment of the present invention.
Figure 9:
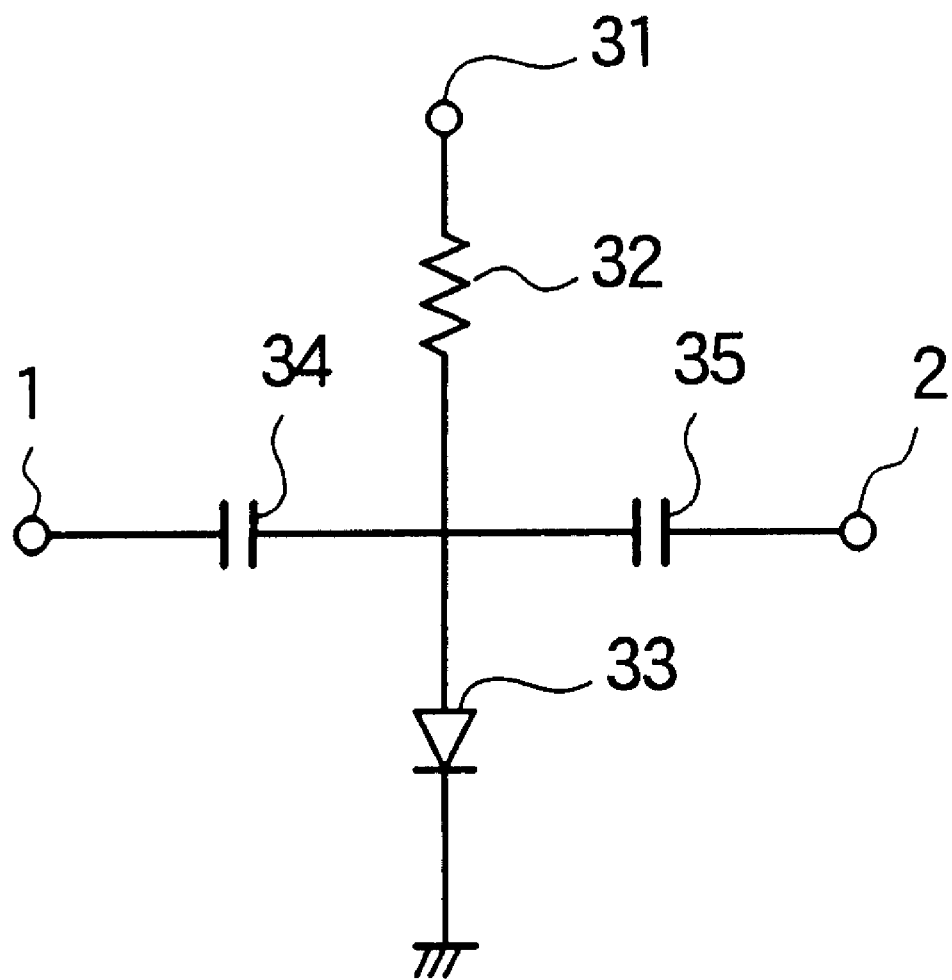
FIG. 9 is a diagram showing the basic structure of a conventional linearizer.
Figure 10:
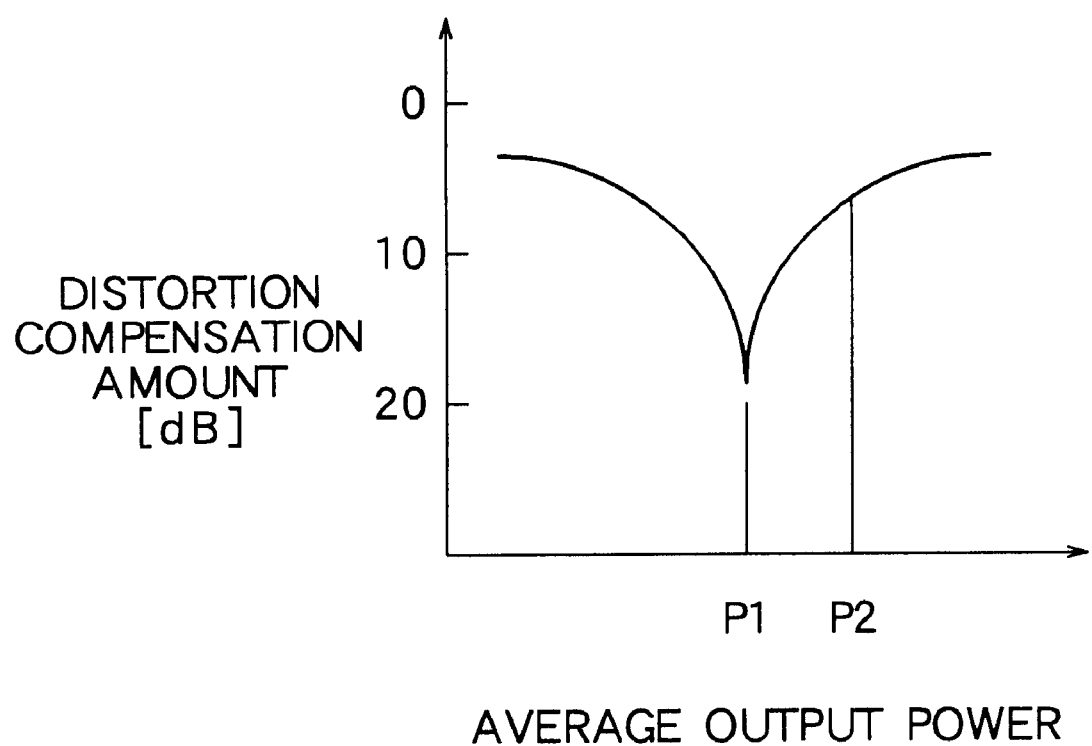
FIG. 10 is a diagram showing the characteristics of the conventional linearizer.
Figure 11:
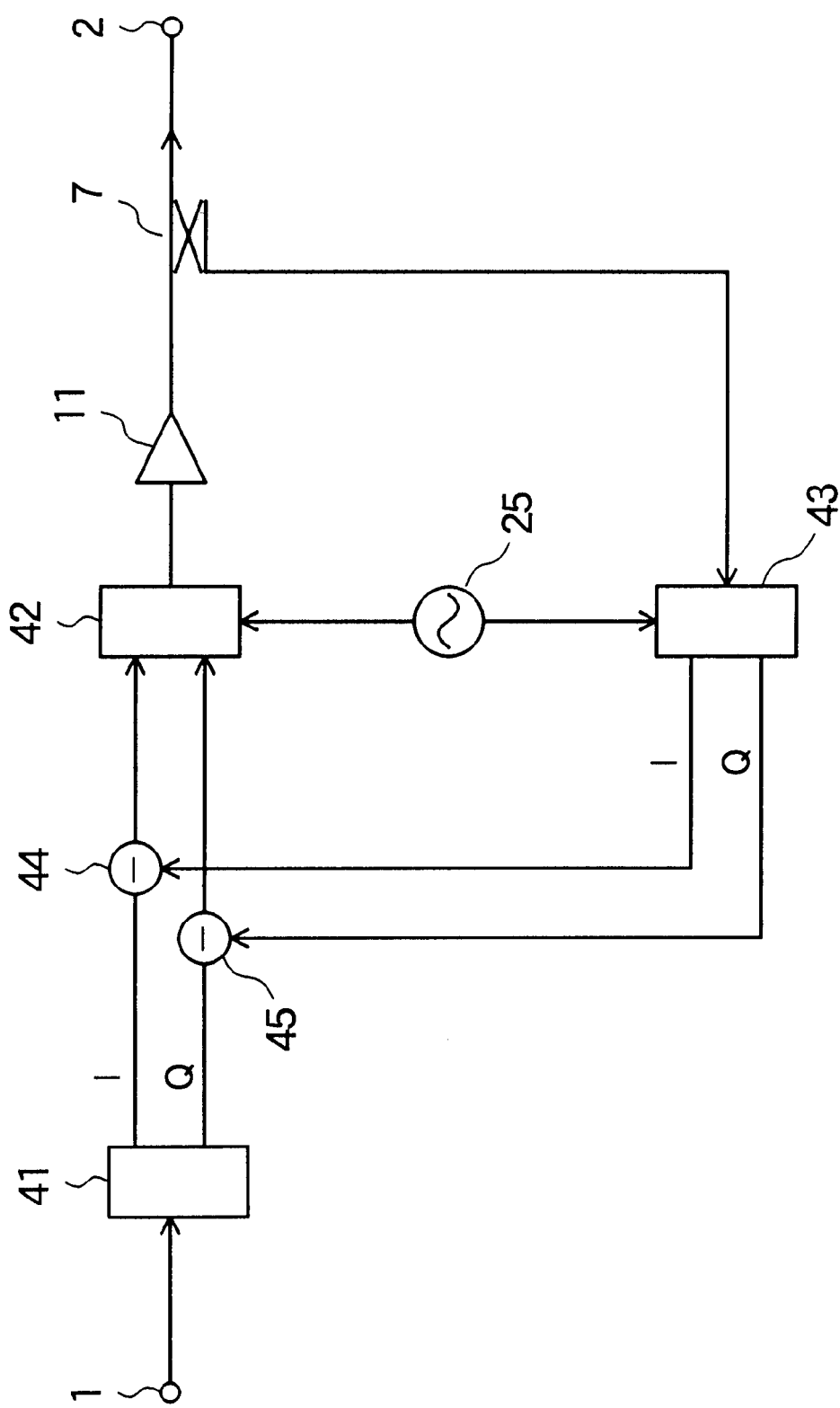
FIG. 11 is a diagram showing the basic structure of another conventional linearizer.

A distortion compensation circuit according to a sixth embodiment of the present invention will be described with reference to the drawing. FIG. 8 is a diagram showing the structure of the distortion compensation circuit according to the sixth embodiment of the present invention.

In FIG. 8, reference numerals 23 and 24 denote frequency converters; and 25, a local oscillator. Note that the other structural aspects are equivalent to those of the first embodiment, and thus repeated descriptions will be omitted.

Next, the operation of the distortion compensation circuit according to the sixth embodiment will be described.

In the distortion compensation circuit according to the sixth embodiment, an intermediate frequency band signal is inputted to the input terminal 1, and the frequency converter 23 in the signal path 3 converts the input signal from intermediate frequencies to radio frequencies, and the frequency converter 24 in the nonlinear signal extraction path 5 converts its input signal from radio frequencies band to intermediate frequencies band. Thus, the vector adjuster 9 and the linearizer 10 operate at intermediate frequencies band.

In the distortion compensation circuit according to the sixth embodiment, the power level is detected by the level detector 12 at intermediate frequencies band and the reverse distortion characteristics are generated by the linearizer 10 also at intermediate frequencies. Therefore, a highly accurate control can be implemented. Note that this structure can, of course, be applied to other embodiments.

What is claimed is:

1. A distortion compensation circuit comprising:

a vector adjuster for electrically adjusting amplitude and phase characteristics of an input signal;

a linearizer, constructed of analog linear and nonlinear elements and having amplitude and phase characteristics opposite to those of an amplifier with respect to changes in input power, which is an output of said vector adjuster, for electrically adjusting the amplitude and phase characteristics with respect to the changes in input power, said amplifier being connected to the succeeding stage of said linearizer;

a linear signal extraction path for extracting part of the input signal from the input side of said vector adjuster;

a nonlinear signal extraction path for extracting part of an output signal from the output side of said amplifier;

a level detector for detecting a combined power level of the signals from said linear signal extraction path and said nonlinear signal extraction path; and a control circuit for adjusting a bias of said linearizer in accordance with the detected combined power level, electrically adjusting said linearizer so that the power detected by said level detector is minimized, and adjusting said vector adjuster so that the power detected by said level detector is minimized every time said linearizer is adjusted.

2. A distortion compensation circuit according to claim 1, wherein said linear signal extraction path has a signal path constructed of said vector adjuster, said linearizer and said amplifier, and a delay circuit for making delay characteristics of said nonlinear signal extraction path equivalent to delay characteristics of said linear signal extraction path.

3. A distortion compensation circuit according to claim 2, further comprising:

a distortion amplification path for causing an auxiliary amplifier to amplify a combined signal obtained by combining the signal of said linear signal extraction path and the signal of said nonlinear signal extraction path; and an output signal path having a second delay circuit for making delay characteristics of said nonlinear signal extraction path and said distortion amplification path equivalent to delay characteristics thereof to thereby form a feed-forward amplifier for compensating for nonlinear characteristics of said amplifier by combining an output signal from said distortion amplification path and an output signal from said output signal path so as to be anti-phase to each other, wherein said level detector extracts a signal at the input side of said auxiliary amplifier in said distortion amplification path, and detects a power level of the extracted signal.

4. A distortion compensation circuit according to claim 2, further comprising:

a distortion amplification path for causing an auxiliary amplifier to amplify a combined signal obtained by combining the signal of said linear signal extraction path and the signal of said nonlinear signal extraction path; and an output signal path having a second delay circuit for making delay characteristics of said nonlinear signal extraction path and said distortion amplification path equivalent to delay characteristics thereof to thereby form a feed-forward amplifier for compensating for nonlinear characteristics of said amplifier by combining an output signal from said distortion amplification path and an output signal from said output signal path so as to be anti-phase to each other, wherein said level detector extracts a signal at the output side of said auxiliary amplifier in said distortion amplification path, and detects a power level of the extracted signal.

5. A distortion compensation circuit according to claim 1, comprising, in place of said linearizer, a reverse distortion amplifier having amplitude and phase characteristics opposite to those of said amplifier connected to the succeeding stage thereof with respect to input power changes, wherein said control circuit electrically controls said reverse distortion amplifier and said vector adjuster in accordance with the detected combined power level.

6. A distortion compensation circuit according to claim 1, further comprising:

a first frequency converter, inserted into the succeeding stage of said linearizer, for converting an output signal from said linearizer from an intermediate frequency to a radio frequency; and a second frequency converter, inserted into said nonlinear signal extraction path, for converting an output signal from said amplifier from a radio frequency to an intermediate frequency.

* * * * *